(12) United States Patent
Oguri

(10) Patent No.: US 6,781,165 B2
(45) Date of Patent: Aug. 24, 2004

(54) HETERO-JUNCTION BIPOLAR TRANSISTOR WITH GOLD OUT-DIFFUSION BARRIER MADE FROM INP OR INGAP

(75) Inventor: Hiroyuki Oguri, Yamanashi (JP)

(73) Assignee: Fujitsu Quantum Devices Limited, Yamanashi (JP)

(*) Notice: Subject to any disclaimer, the term of this patent is extended or adjusted under 35 U.S.C. 154(b) by 0 days.

(21) Appl. No.: 10/347,694

(22) Filed: Jan. 22, 2003

(65) Prior Publication Data

US 2003/0183846 A1 Oct. 2, 2003

(30) Foreign Application Priority Data

Mar. 26, 2002 (JP) ........................................ 2002-087196

(51) Int. Cl.[7] ................. H01L 31/032; H01L 31/033; H01L 31/06
(52) U.S. Cl. .................. 257/197; 257/185; 257/201
(58) Field of Search ............................. 257/185, 187, 257/190, 197, 201

(56) References Cited

U.S. PATENT DOCUMENTS 5,682,046 A * 10/1997 Takahashi et al. .......... 257/198
6,147,371 A * 11/2000 Tanaka ...................... 257/197

FOREIGN PATENT DOCUMENTS

| JP | 62-20373 | 1/1987 |
|----|----------|--------|
| JP | 5-152318 | 6/1993 |
| JP | 8-195401 | 7/1996 |
| JP | 2000-332024 | 11/2000 |
| JP | 2001-35859 | 2/2001 |

OTHER PUBLICATIONS

Japanese Office Action dated Mar. 2, 2004 (with translation).

* cited by examiner

Primary Examiner—Minhloan Tran
Assistant Examiner—Thomas L Dickey
(74) Attorney, Agent, or Firm—Armstrong, Kratz, Quintos, Hanson & Brooks, LLP.

(57) ABSTRACT

A hetero-junction bipolar transistor includes a collector layer, a base layer and an emitter layer, an emitter electrode containing Au being provided for the emitter layer, and an Au-diffusion barrier layer of InP or InGaP interposed between the emitter electrode and the base layer.

18 Claims, 5 Drawing Sheets

RATE OF Au DIFFUSION IN COMPOUND SEMICONDUCTOR
(Ie=6E4A/cm2)

ESTIMATED HBT LIFETIME BY HIGH-TEMPERATURE BURN-IN TEST

HETERO-JUNCTION BIPOLAR TRANSISTOR WITH GOLD OUT-DIFFUSION BARRIER MADE FROM INP OR INGAP

BACKGROUND OF THE INVENTION

1. Field of the Invention

The present invention generally relates to compound semiconductor integrated circuit devices, and more particularly, to a hetero-junction bipolar transistor.

2. Description of the Related Art

A conventional hetero-junction bipolar transistor (hereinafter referred to as HBT simply) having an AlGaAs emitter layer is known. An emitter contact layer is provided on the AlGaAs emitter layer to make an ohmic contact with the emitter layer. An emitter electrode containing gold (Au) is provided on the emitter contact layer. A barrier layer made of a refractory metal such as titanium (Ti) may underlie the emitter electrode in order to prevent Au of the emitter electrode from diffusing into the AlGaAs emitter layer.

However, the barrier metal made of the refractory metal cannot prevent diffusion of Au into the AlGaAs emitter layer perfectly. Au diffused into the emitter layer may induce electromigration, which degrades the performance of the transistor. Further, Au of the emitter electrode may diffuse into a base layer that underlies the emitter layer. Au diffused into the base layer may result in a base leakage current. Thus, the conventional HBT is not reliable for a long period of time.

SUMMARY OF THE INVENTION

It is a general object of the present invention to provide a hetero-junction semiconductor bipolar transistor in which the above disadvantages are eliminated.

A more specific object of the present invention is to provide a hetero-junction semiconductor bipolar transistor in which diffusion of Au into an epitaxial layer can be prevented and high reliability can be secured for a long term.

The above objects of the present invention are achieved by a hetero-junction bipolar transistor comprising: a collector layer, a base layer and an emitter layer, an emitter electrode containing Au being provided for the emitter layer; and an Au-diffusion barrier layer of one of InP and InGaP interposed between the emitter electrode and the base layer.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

A description will first be given, with reference to FIG. 1, of an HBT related to the present invention in order to facilitate better understanding of the present invention.

Figure 1:
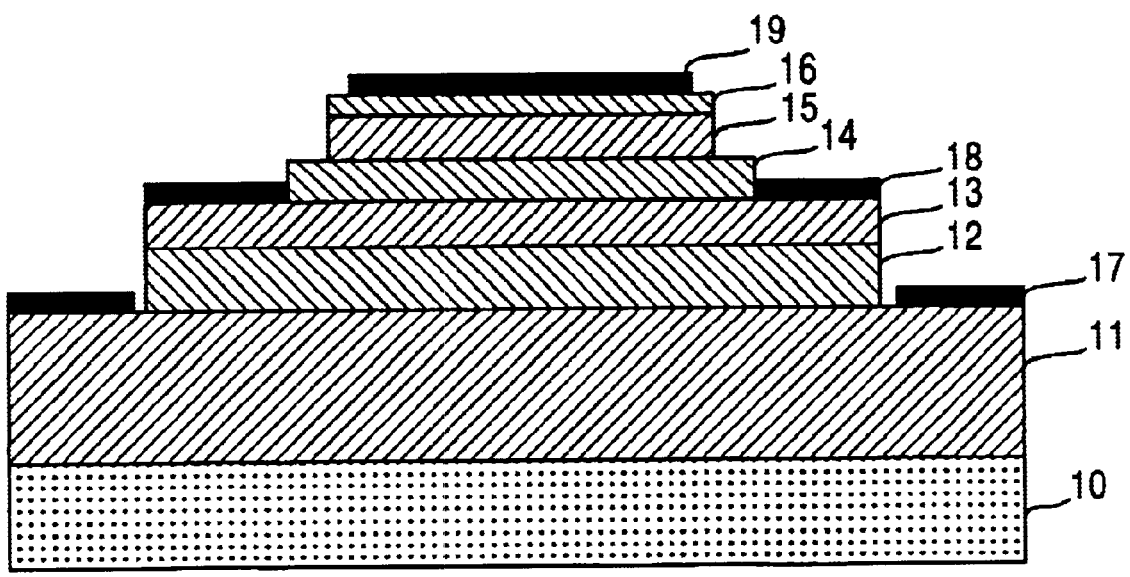
FIG. 1 is a cross-sectional view of an HBT related to the present invention.

Referring to FIG. 1, there is illustrated an HBT having an AlGaAs emitter layer. On a semi-insulating GaAs substrate 10, provided are an $n^+$-type GaAs contact layer 11, an n-type GaAs collector layer 12, a $p^+$-type GaAs base layer 13, an n-type AlGaAs emitter layer 14, an $n^+$-type GaAs emitter contact layer 15, and an $n^+$-InGaAs emitter contact layer 16, which layers are epitaxially grown in this order. The collector contact layer 11 makes an ohmic contact with the collector electrode 17. Similarly, the $n^+$-type GaAs emitter contact layer 15 and the $n^+$-InGaAs emitter contact layer 16 act to make an ohmic contact with the emitter electrode 19. The collector layer 12, the base layer 13 and the emitter layer 14 form an npn junction, so that an npn bipolar transistor is formed. Generally, the emitter layer 14 is made of n-type AlGaAs, which a wider gap than GaAs, and easily makes lattice match with GaAs.

An emitter electrode 19 has a layer structure of Ti/Pt/Au, and a base electrode 18 has a layer structure of Pt/Ti/Pt/Au, a collector electrode 17 having a layer structure of AuGe/Ni/Au. Generally, the electrodes are made of Au-based materials. As is known, the Au-based materials do not need sophisticated dry etching but can be shaped into the electrodes by deposition and liftoff. Further, the Au-based materials have high resistance to electromigration. For the emitter electrode 19 containing Au, a barrier metal made of a refractory metal such as Ti may be interposed between the Au layer and the epitaxial layer in order to prevent Au from diffusing into the epitaxial layer.

However, the barrier metal of refractory metal such as Ti cannot prevent diffusion of Au perfectly. In practice, Au diffuses into the epitaxial layers 16, 15 and 14 in this order. When Au becomes close to the base layer, a leakage current between the emitter and base increases. In an extreme case, the emitter and the base are short-circuited. Diffusion of Au is caused by electromigration due to the emitter current, and is a serious problem in terms of the long-term reliability of HBT. As the base leakage current increases, the ratio of the collector current Ic to the base current Ib including the base leakage current, namely, the current gain $H_{FE}$ (=Ic/Ib) is degraded. Degradation of $H_{FE}$ causes malfunction of IC circuits and degradation of power characteristics.

It can be seen from the above that the refractory barrier metal that is a popular means for preventing diffusion of Au does not exhibit its expected performance well due to electromigration, particularly, under the condition that a large amount of emitter current flows as in the case of HBT.

In the case where the emitter electrode 19 is formed by deposition, if barrier metals of Ti and Au are deposited in turn with the same mask, Au may be deposited so as to spread over the outside of the Ti layer along the sidewalls thereof. There is a possibility that a peripheral portion of the emitter electrode 19 may contact the underlying emitter contact layer in the absence of the metal barrier layer. The above problem is more serious as the Au layer is thicker relative to the thickness of the metal barrier layer. In order to prevent Au from spreading over along the sidewalls of the barrier layer, it may be conceivable to deposit the barrier metal to a large thickness relative to the thickness of the Au layer. However, another problem will arise from the above. The resistance of the emitter increases due to an increased resistance of the barrier metal.

Another refractory metal that exhibits higher barrier performance to Au than Ti, such as TiW cannot be used to form the barrier layer by deposition and liftoff. Rather, such a refractor metal needs two separate steps of photolithography and dry etching. This might result in considerably different sizes of the emitter electrode layer.

A situation in which the diffusion of Au does not reach the base layer is not enough to suppress the base leakage current very well. This is because, when diffusion of Au progresses close to the depletion layer at the emitter-base junction, recombination current is liable to flow between the emitter and base. Recombination current develops due to such a mechanism that electrons and holes are recombined via impurities or crystal defects in the depletion layer at the pn junction.

For the above-mentioned reasons, it is difficult to provide HBTs that are reliable for a long term.

The present invention takes into consideration the above and provides an HBT that is highly reliable for a long term by more effectively preventing diffusion of Au into an epitaxial layer.

First of all, the principles of the present invention are described.

(Principles of the Invention)

The present inventors conducted a high-temperature burn-in test of HBT samples and analyzed defective samples by observing an increased base leakage current. The inventors found out from the test results that there are different rates of Au diffusion for different compound semiconductors.

Figure 2:
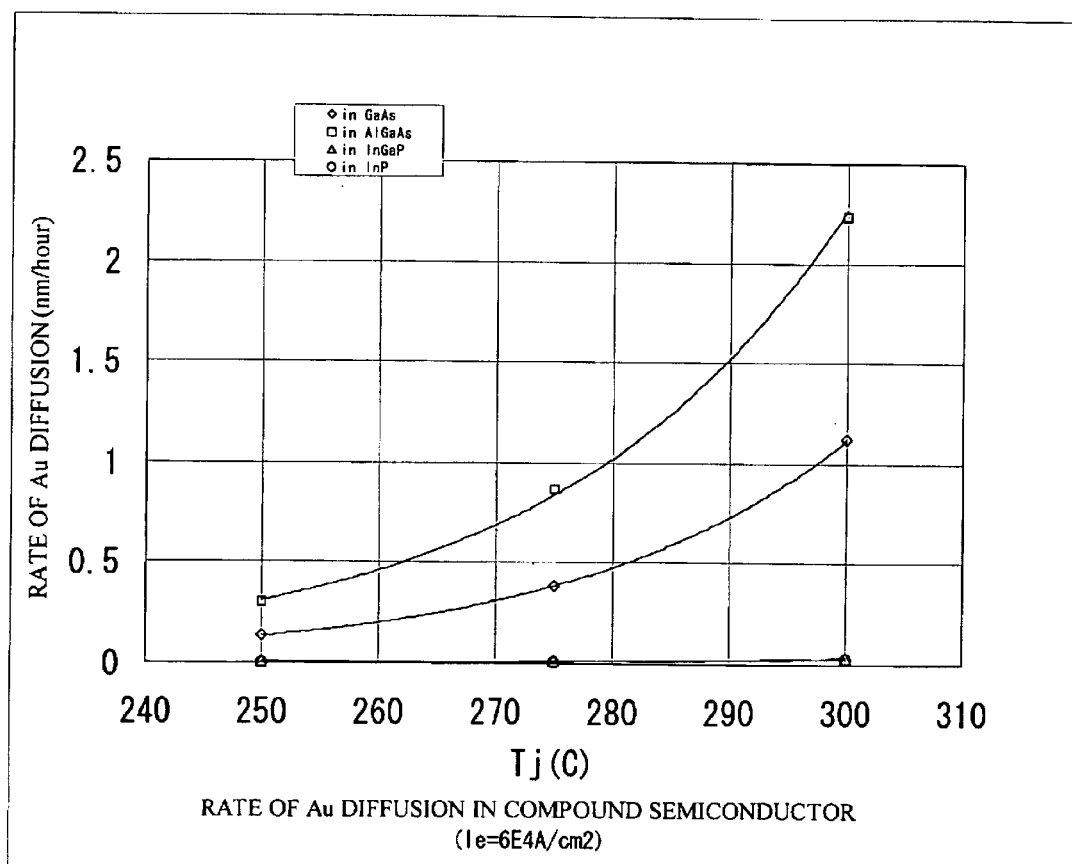
FIG. 2 is a graph showing results of experiments conducted by the inventors in which the rates of Au into compound semiconductors are measured.

The inventors investigated the rates of diffusion of Au into different compound semiconductors in the HBT structure. The results of the investigation are shown in FIG. 2. The inventors found out that the rate of diffusion of Au in InP and $In_yGa_{1-y}P$ (y=0.5) is equal to or lower than 1/30 of the rate of diffusion of Au in GaAs and is equal to or lower than 1/70 of the rate of diffusion of Au in $Al_xGa_{1-x}As$ (x=0.3) irrespective of the junction temperature Tj of HBT. The horizontal axis of the graph of FIG. 2 denotes the junction temperature (° C.), and the vertical axis thereof the rate of diffusion of Au (nm/hour). It can be seen from the above experimental results that an InP or InGaP layer interposed between the emitter electrode and the base layer serves as a barrier layer that prevents Au into the base layer.

In this case, even when diffusion of Au is blocked by the Au-diffusion barrier layer, if the Au-diffusion barrier layer is too close to the base layer, recombination current may flow between the emitter and base.

The inventors conducted another experiment to examine samples having an InGaP layer substituted for the AlGaAs emitter layer 14 in the HBT of FIG. 1. For the InGaP emitter layer having a thickness of 30 nm, diffusion of Au stops in the uppermost portion of the InGaP emitter layer, but the HBT has an estimated lifetime as short as about three years with the junction temperature Tj equal to 120° C. For the InGaP emitter layer having a thickness of 50 nm, the HBT has a satisfactory lifetime as long as about ten years with the junction temperature Tj equal to 120° C. It can be seen from the above that sufficient reliability can be secured when diffusion of Au is stopped in a distance of 50 nm or longer measured from the base layer 13. As a result of the above consideration, preferably, an Au-diffusion barrier layer made of InP or InGaP is arranged between the emitter layer to which the base layer contacts and the emitter electrode containing Au and is located at a distance as long as 50 nm or longer away from the base layer.

The thickness of the Au-diffusion barrier layer of InP or InGaP will now be considered. One consequence is that the lower limit of the thickness of the Au-diffusion barrier layer made of InP or InGaP is approximately equal to 3 nm. Even InP or InGaP cannot realize the perfect blocking of Au diffusion but may allow only slight diffusion of Au. The above-mentioned lower limit to 3 nm is determined taking into account the above and is enough thick to effectively prevent Au from diffusing into the underlying layer. Since the rate of Au diffusion at 300° C. is about 0.03 nm/h (see FIG. 2), it takes about 100 hours for Au to pass through the InP or InGaP barrier layer having a thickness of 3 nm. Assuming that the activation energy Ea for degradation is equal to 0.8 eV, the mean time to fail (MTTF) at 120° C. is 10E5 hours (=11.4 years), which is longer than ten years of the general target reliability. Thus, if reliability over ten years is desired, the InP or InGaP barrier layer for blocking Au diffusion may have a thickness thicker than 3 nm. Similarly, if reliability over 25 years is desired, the InP or InGaP barrier layer should have a thickness equal to 7 nm or more.

Even if Au passes through the InP or InGaP barrier layer and enters into the underlying layer, a large amount of Au is blocked by the barrier layer, so that the underlying layer is less affected by diffusion of Au.

The present invention includes not only HBTs having the AlGaAs emitter layer to which the base layer contacts but also HBTs having an InP or InGaP emitter layer. When the emitter layer is made of InP or InGaP, the emitter layer itself has the function of blocking Au and preventing Au from diffusing into the underlying layer. The mechanism of preventing Au from diffusing into the emitter layer or reducing the amount of diffusion of Au in the emitter layer improves the device performance and reliability. Therefore, it is useful to provide the InP or InGaP barrier layer for blocking diffusion of Au above the InP or InGaP emitter layer via an intermediate semiconductor layer.

The barrier layer for blocking Au diffusion may have a multilayer structure in which InP or InGaP barrier layers are laminated via an intervening compound semiconductor layer. In this case, it is preferable that the total thickness of the InP or InGaP barrier layers is equal to or greater than 3 nm. If it is desired to secure reliability for a longer term, the sum of the thicknesses of the InP or InGaP barrier layers is equal to or greater than 7 nm. The multilayer structure of the barrier layer may include layers of different compound semiconductors.

The emitter electrode may have a multilayer structure that includes an Au layer or another multilayer structure that includes an alloy layer containing Au and another metal.

The emitter layer and the InP or InGaP barrier layer may contact each other or may be separated from each other via a semiconductor layer, which may have a different material, a different impurity or a different impurity concentration. Such an interposed semiconductor layer may be GaAs or InGaAs.

(First Embodiment)

Figure 3:
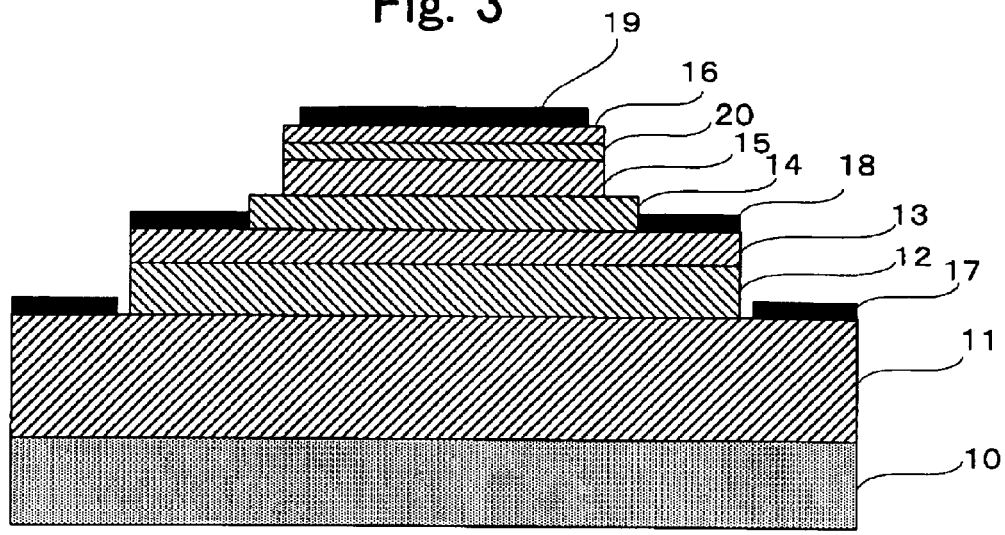
FIG. 3 is a cross-sectional view of an HBT according to a first embodiment of the present invention.

FIG. 3 is a cross-sectional view of an AlGaAs/GaAs type HBT according to a first embodiment of the present invention, wherein parts that are the same as those shown in FIG. 1 are given the same reference numerals.

Referring to FIG. 3, an n-type InGaP barrier or block layer 20 that functions to prevent diffusion of Au is interposed between the $n^+$-type GaAs emitter contact layer (which may be referred to as spacer layer) 15 and the InGaAs emitter contact layer 16. The Au-diffusion barrier layer 20 is 50 nm or longer away from the base layer 13, and has a thickness of 3 nm or more. The barrier layer 20 is 7 nm thick or more if reliability for a longer term is desired. The $n^+$-type spacer layer 15 is interposed between the emitter layer 14 and the Au-diffusion barrier layer 20, and has a different material, impurity or impurity concentration different from those of the Au-diffusion barrier layer 20.

A more specific example of the HBT according to the first embodiment of the present invention is described below as a first example.

The epitaxial wafer is configured as follows. On the semi-insulating GaAs substrate 10, provided are the collector contact layer 11 (n-type GaAs, 5E18 cm$^{-3}$, 500 nm), the collector layer 12 (n-type GaAs, 2E16 cm$^{-3}$, 500 nm), the base layer 13 (p$^+$-type GaAs, 2E19 cm$^{-3}$, 50 nm), the emitter layer 14 (n-type AlGaAs, 5E17 cm$^{-3}$, 50 nm), the spacer layer 15 (n$^+$-GaAs, 5E18 cm$^{-3}$, 50 nm), the Au-diffusion barrier layer 20 (n-type InGaP, 3E18 cm$^{-3}$, 10 nm), and the emitter contact layer 16 (n$^+$-type InGaAs, 1E19 cm$^{-3}$, 200 nm), these layers being epitaxially grown in this order.

The wafer process is as follows. First, the emitter electrode 19 of Ti/Pt/Au (50 nm/50 nm/100 nm) is formed. Next, the area in the vicinity of the emitter electrode 19 is mesa-etched as follows. The InGaAs emitter contact layer 16 is wet-etched by H$_2$SO$_4$—H$_2$O$_2$-based etchant. The Au-diffusion barrier layer 20 made of InGaP is wet-etched by HCl. The GaAs spacer layer 15 is wet-etched by H$_2$SO$_4$–H$_2$O$_2$-based etchant. Then, the AlGaAs emitter layer 14 is etched by H$_2$SO$_4$—H$_2$O$_2$-based etchant in an area in the vicinity of the emitter mesa in which the base electrode 18 is to be formed, so that the GaAs base layer 13 is partially exposed. Then, the base electrode 18 of Pt/Ti/Pt/Au (30 nm/30 nm/50 nm/1000 nm) is formed on the exposed area of the GaAs base layer 13. Thereafter, the outer portion of the base electrode 18 is mesa-etched up to the collector contact layer 11. This is base-mesa etching with H$_2$SO$_4$—H$_2$O$_2$-based etchant. Finally, the collector electrode 17 of AuGe/Ni/Au (60 nm/20 nm/1000 nm) is formed on the collector contact layer 11 outside of the base mesa. The emitter, base and collector 19, 18 and 17 are formed by patterning of photoresist, deposition and liftoff.

(Second Embodiment)

Figure 4:
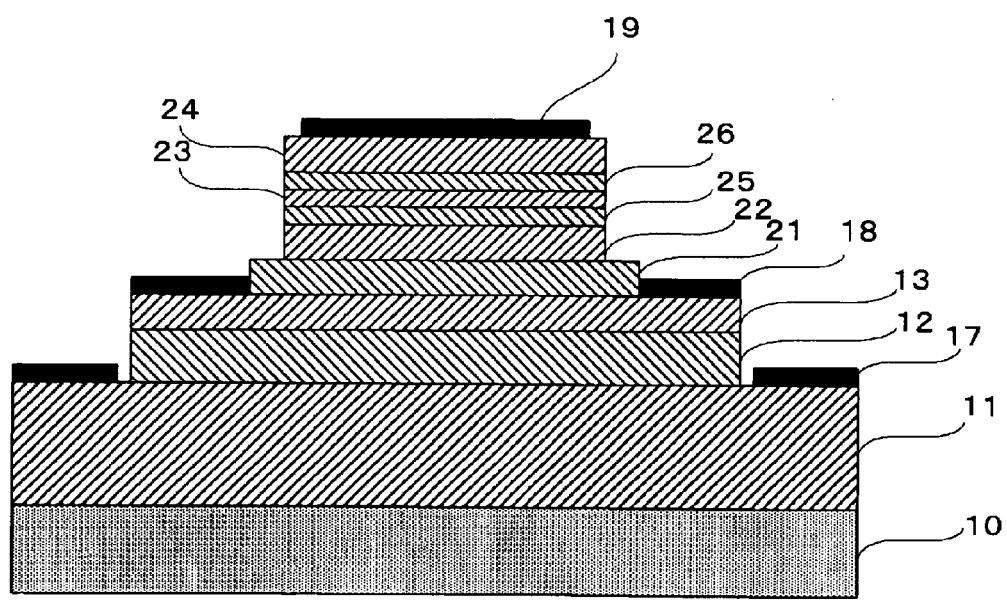
FIG. 4 is a cross-sectional view of an HBT according to a second embodiment of the present invention.

FIG. 4 is a cross-sectional view of an InGaP/GaAs type HBT according to a second embodiment of the present invention, wherein parts that are the same as those shown in FIG. 1 are given the same reference numbers.

Referring to FIG. 4, an emitter layer 21 is made of n-type InGaP. An n$^+$-type GaAs spacer layer 22 is provided on the emitter layer 21. An n-type InGaP barrier layer 25 for blocking diffusion of Au is provided on the spacer layer 22. An n$^+$-type GaAs spacer layer 23 is provided on the Au-diffusion barrier layer 25. Another n-type InGaP barrier layer 26 for blocking diffusion of Au is provided on the spacer layer 23. The n$^+$-type InGaAs emitter contact layer 24 is provided on the Au-diffusion barrier layer 26. The emitter electrode 19 is provided on an emitter contact layer 24. The Au-diffusion barrier layer 25 is at a distance as long as 50 nm or longer away from the base layer 13. The sum of the thicknesses of the Au-diffusion barrier layers 25 and 26 is preferably equal to or larger than 3 nm, and may be set equal to or larger than 7 nm if it is desired to secure reliability for a longer term.

A more specific example of the HBT according to the second embodiment of the present invention is described below as a second example.

The epitaxial wafer is configured as follows. On the semi-insulating GaAs substrate 10, provided are the collector contact layer 11 (n-type GaAs, 5E18 cm$^{-3}$, 500 nm), the collector layer 12 (n-type GaAs, 2E16 cm$^3$, 500 nm), the base layer 13 (p$^+$-type GaAs, 2E19 cm$^{-3}$, 50 nm), the emitter layer 21 (n-type InGaP, 5E17 cm$^{-3}$, 30 nm), the emitter contact (spacer) layer 22 (n$^+$-GaAs, 5E18 cm$^{-3}$, 20 nm), the Au-diffusion barrier layer 25 (n-type InGaP, 3E18 cm$^{-3}$, 5 nm), the emitter contact (spacer) layer 23 (n-GaAs, 5E18 cm$^{-3}$, 10 nm), the Au-diffusion barrier layer 26 (n-type InGaP, 3E18 cm$^{-3}$, 5 nm), and the emitter contact layer 24 (n$^+$-type InGaAs, 1E19 cm$^{-3}$, 100 nm), these layers being epitaxially grown in this order.

The wafer process is as follows. First, the emitter electrode 19 of Ti/Pt/Au (50 nm/50 nm/100 nm) is formed. Next, the area around the emitter electrode 19 is mesa-etched as follows. The InGaAs emitter contact layer 24 and the GaAs spacer layers 22 and 23, and the Au-diffusion barrier layers 25 and 26 of InGaP are alternately wet-etched. The InGaAs emitter contact layer 24 and the GaAs spacer layers 22 and 23 are etched by H$_2$SO$_4$—H$_2$O$_2$-based etchant. The Au-diffusion barrier layers 25 and 26 of InGaP are wet-etched by HCl. Then, the InGaP emitter electrode 21 is etched by HCl in a portion in the vicinity of the emitter mesa in which the base electrode 13 is to be formed, so that the GaAs base layer 13 is partially exposed. Then, the base electrode of Pt/Ti/Pt/Au (30 nm/30 nm/50 nm/1000 nm) is formed on the exposed area of the GaAs base layer 13. Thereafter, the outer portion of the base electrode 18 is mesa-etched up to the collector contact layer 11. This is base-mesa etching with H$_2$SO$_4$—H$_2$O$_2$-based etchant. Finally, the collector electrode 17 of AuGe/Ni/Au (60 nm/20 nm/1000 nm) is formed on the collector contact layer 11 outside of the base mesa. The emitter, base and collector electrodes 19, 18 and 17 are formed by patterning of photoresist, deposition and liftoff.

The HBT shown in FIG. 4 has two Au-diffusion barrier layers. According to the present invention, the InGaP/GaAs type HBT may have three or more Au-diffusion barrier layers. The AlGaAs/GaAs type HBT may have two or more Au-diffusion barrier layers. The Au-diffusion barrier layers 25 and 26 may have different materials.

(Third Embodiment)

Figure 5:
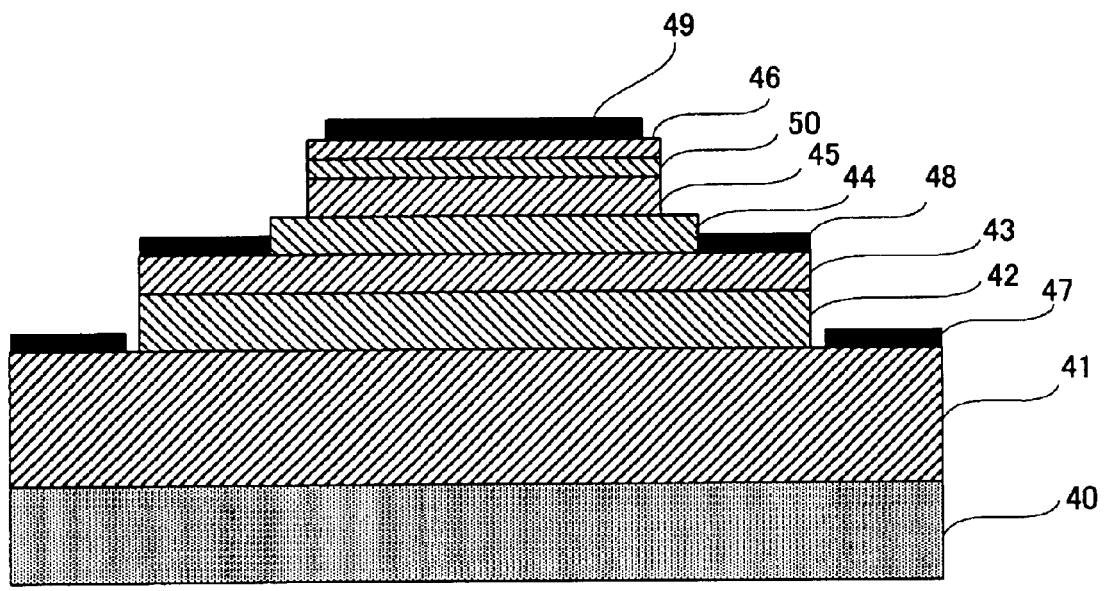
FIG. 5 is a cross-sectional view of an HBT according to a third embodiment of the present invention.

FIG. 5 is a cross-sectional view of an InP/InGaAs HBT according to a third embodiment of the present invention.

The HBT of FIG. 5 has, on a semi-insulating InP substrate 40, an n$^+$-type InGaAs collector contact layer 41, an n-type InP collector layer 42, a p-type InGaAs base layer 43, an n-type InP emitter layer 44, an n type InGaAs emitter contact (spacer) layer 45, an n-type InP barrier layer 50 for blocking diffusion of Au, and an n$^+$-type InGaAs emitter contact layer 46, these layers being epitaxially laminated. The n$^+$-type InGaAs collector contact layer 41 is provided to make an ohmic contact with the collector electrode 47. Similarly, n$^+$-type InGaAs emitter contact layers 45 and 46 are provided to make an ohmic contact between the emitter electrode 49 and the emitter layer 44. The collector layer 42, the base layer 43 and the emitter layer 44 define an npn junction, so that an npn bipolar transistor is formed.

The Au-diffusion barrier layer 50 of n-type InP interposed between the n$^+$-type InGaAs spacer layer 45 and the n$^+$-type InGaAs emitter contact layer 46 is 50 nm or longer away from the base layer 43, and has a thickness of 3 nm or more. If it is desired to secure reliability for a longer term, the Au-diffusion barrier layer 50 is preferably 7 nm thick or more. The n$^+$-type InGaAs spacer layer 45 is interposed between the emitter layer 44 and the Au-diffusion barrier layer 50, and has a different material, impurity or an impurity concentration from those of the n-type InP emitter layer 44 and the n-type InP layer that serves as the Au-diffusion barrier layer 50.

A more specific example of the HBT according to the third embodiment of the present invention is described below as a third example.

The epitaxial wafer is configured as follows. On the semi-insulating InP substrate 40, provided are the collector contact layer 41 (n-type InGaAs, 1E19 cm$^{-3}$, 200 nm), the collector layer 42 (n-type InP, 5E16 cm$^{-3}$, 500 nm), the base layer 43 (p-type InGaAs, 2E19 cm$^{-3}$, 70 nm), the emitter layer 44 (n-type InP, 5E17 cm$^{-3}$, 50 nm), the spacer layer 45 (n$^+$-InGaAs, 3E18 cm$^{-3}$, 50 nm), the Au-diffusion barrier layer 50 (n-type InP, 2E18 cm$^{-3}$, 5 nm), and the emitter contact layer 46 (n$^+$-type InGaAs, 1E19 cm$^{-3}$, 200 nm), these layers being epitaxially grown in this order.

The wafer process is as follows. First, the emitter electrode 49 of Ti/Pt/Au (50 nm/50 nm/100 nm) is formed. Next, the area in the vicinity of the emitter electrode 49 is mesa-etched as follows. The InGaAs emitter contact layer 46 is wet-etched by $H_2SO_4$—$H_2O_2$-based etchant. The Au-diffusion barrier layer 50 made of InP is wet-etched by HCl. The InGaAs spacer layer 45 is wet-etched by $H_2SO_4$—$H_2O_2$-based etchant. Then, the InP emitter layer 44 is etched by HCl in an area in the vicinity of the emitter mesa in which the base electrode 18 is to be formed, so that the InGaAs base layer 43 is partially exposed. Then, the base electrode 48 of Pt/Ti/Pt/Au (30 nm/30 nm/50 nm/1000 nm) is formed on the exposed area of the InGaAs base layer 43. Thereafter, the outer portion of the base electrode 48 is mesa-etched up to the collector contact layer 41, so that a base mesa can be formed. In this etching, the InGaAs base layer 43 is etched by $H_2SO_4$—$H_2O_2$-based etchant, and the InP collector layer 42 is etched by HCl. Finally, the collector electrode 47 of AuGe/Ni/Au (60 nm/20 nm/1000 nm) is formed on the collector contact layer 41 outside of the base mesa. The emitter, base and collector electrodes 49, 48 and 47 are formed by patterning of photoresist, deposition and liftoff.

The above-mentioned third embodiment of the invention may be varied so as to have two or more Au-diffusion barrier layers.

Figure 6:
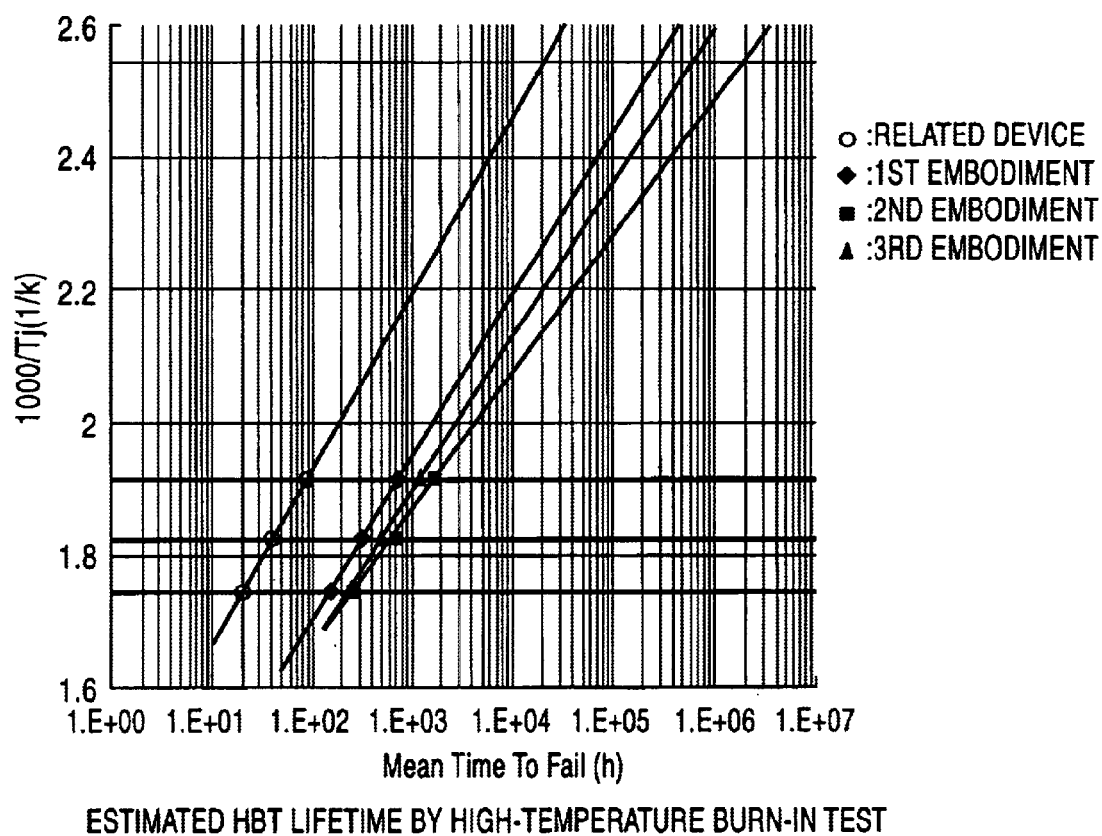
FIG. 6 is a graph of results of experiments conducted by the inventors in which the lifetimes of HBTs are measured by a high-temperature burn-in test.

FIG. 6 shows the results of high-temperature burn-in tests of the first through third examples and a comparative HBT equipped with no InP or InGaP barrier layer for preventing diffusion of Au. FIG. 6 shows the MTTF values observed in which the samples are defined as defective ones when the current gain $H_{FE}$ decreases to 70% from its initial value. The vertical axis denotes 1000/Tj(1/K), where Tj is the junction temperature. By extrapolation of the MTTF values at 250, 275 and 300° C. (three lower-side thick solid lines), the MTTF values of AlGaAs/GaAs type HBT and InGaP/GaAs type HBT obtained when Tj=120° C. (an upper-side thick solid line) are respectively increased to approximately 20 times and 100 times of those of the related device by applying the present invention to these types of HBT.

According to the present invention, diffusion of Au is blocked by the InP or InGaP barrier layer, so that the long lifetime, highly reliable HBTs having only a very little decrease of $H_{FE}$ can be realized.

In the first through third embodiments of the invention, the spacer layer interposed between the emitter layer and the Au-diffusion barrier layer may be omitted so that the Au-diffusion barrier layer contacts the emitter layer.

The present invention is not limited to the specifically disclosed embodiments, and other embodiments, variations and modifications may be made without departing from the scope of the present invention.

The present invention is based on Japanese patent application no. 2002-087196 filed on May 26, 2002, the entire disclosure of which is hereby incorporated by reference.

What is claimed is:

1. A hetero-junction bipolar transistor comprising:
    a collector layer, a base layer and an emitter layer, an emitter electrode containing Au being provided for the emitter layer;
    an Au-diffusion barrier layer of one of InP and InGaP interposed between the emitter electrode and the base layer; and
    a semiconductor layer interposed between the emitter layer and the Au-diffusion barrier layer, the semiconductor layer having a different material, impurity or impurity concentration from those of the emitter layer and the Au-diffusion barrier layer.

2. The hetero-junction bipolar transistor according to claim 1, wherein the Au-diffusion barrier layer is 50 nm or longer away from the base layer.

3. The hetero-junction bipolar transistor according to claim 1, wherein the Au-diffusion barrier layer has a thickness equal to or larger than 3 nm.

4. The hetero-junction bipolar transistor according to claim 1, wherein the Au-diffusion barrier layer has a thickness equal to or larger than 7 nm.

5. A hetero-junction bipolar transistor comprising:
    a collector layer, a base layer and an emitter layer, an emitter electrode containing Au being provided for the emitter layer; and
    an Au-diffusion barrier layer of one of InP and InGaP interposed between the emitter electrode and the base layer,
    wherein the Au-diffusion barrier layer comprises a plurality of layers laminated via an intervening compound semiconductor layer and interposed between the emitter layer and the emitter electrode.

6. The hetero-junction bipolar transistor according to claim 5, wherein the sum of the thicknesses of the plurality of layers is equal to or larger than 3 nm.

7. The hetero-junction bipolar transistor according to claim 5, wherein the sum of the thicknesses of the plurality of layers is equal to or larger than 7 nm.

8. The hetero-junction bipolar transistor according to claim-5, wherein the plurality of compound semiconductor layers comprise different materials.

9. The hetero-junction bipolar transistor according to claim 1, wherein the emitter layer comprises one of AlGaAs, InP and InGaP.

10. The hetero-junction bipolar transistor according to claim 1, wherein the emitter electrode comprises a layer of Au.

11. The hetero-junction bipolar transistor according to claim 1, wherein the emitter electrode comprises an alloy of Au and another metal.

12. A hetero-junction bipolar transistor comprising:
    a collector layer, a base layer and an emitter layer, an emitter electrode containing Au being provided for the emitter layer; and
    an Au-diffusion barrier layer of one of InP and InGaP interposed between the emitter electrode and the base layer,
    wherein:
        the collector layer comprises GaAs, the base layer comprises GaAs, and the emitter layer comprises AlGaAs; and
        the Au-diffusion barrier layer comprises InGaP.

13. A hetero-junction bipolar transistor comprising:
    a collector layer, base layer and an emitter layer, an emitter electrode containing Au being provided for the emitter layer; and
    an Au-diffusion barrier layer of one of InP and InGaP interposed between the emitter electrode and the base layer, wherein:
the collector layer comprises InP, the base layer comprises LnGaAs, and the emitter layer comprises InP; and
the Au-diffusion barrier layer comprises InP.

14. The hetero-junction bipolar transistor according to claim 5, wherein the Au-diffusion barrier layer is 50 nm or longer away from the base layer.

15. The hetero-junction bipolar transistor according to claim 5, wherein the emitter layer comprises one of AlGaAs, InP and InGaP.

16. The hetero-junction bipolar transistor according to claim 5, wherein the emitter electrode comprises a layer of Au.

17. The hetero-junction bipolar transistor according to claim 5, wherein the emitter electrode comprises an alloy of Au and another metal.

18. A hetero-junction bipolar transistor comprising:

a GaAs collector layer;

a GaAs base layer;

an InGaP emitter layer;

an emitter electrode that is provided for the InGaP emitter layer and contains Au;

an Au-diffusion barrier layer that is interposed between the emitter electrode and the InGaP emitter layer and includes a first InGaP layer and a second InGaP layer; and a GaAs spacer layer sandwiched between the first and second InGaP layers.

* * * * *